US008968602B2

(12) United States Patent
Su et al.

(10) Patent No.: US 8,968,602 B2
(45) Date of Patent: Mar. 3, 2015

(54) SYNTHESIS OF POLYMER NANOSTRUCTURES WITH CONDUCTANCE SWITCHING PROPERTIES

(75) Inventors: Kai Su, Harrison, NJ (US); Nurxat Nuraje, Brooklyn, NY (US); Lingzhi Zhang, Madison, WI (US); Hiroshi Matsui, Glen Rock, NJ (US); Nan Loh Yang, Staten Island, NY (US)

(73) Assignee: Research Foundation of the City University of New York, New York, NY (US)

( * ) Notice: Subject to any disclaimer, the term of this patent is extended or adjusted under 35 U.S.C. 154(b) by 1340 days.

(21) Appl. No.: 12/441,706

(22) PCT Filed: Oct. 2, 2007

(86) PCT No.: PCT/US2007/080206
§ 371 (c)(1),
(2), (4) Date: Mar. 27, 2009

(87) PCT Pub. No.: WO2008/156492
PCT Pub. Date: Dec. 24, 2008

(65) Prior Publication Data
US 2009/0314998 A1    Dec. 24, 2009

Related U.S. Application Data

(60) Provisional application No. 60/827,808, filed on Oct. 2, 2006.

(51) Int. Cl.
*H01B 1/00* (2006.01)
*H01M 4/88* (2006.01)
(Continued)

(52) U.S. Cl.
CPC ............ *H01L 51/0037* (2013.01); *H01B 1/124* (2013.01); *H01L 51/0575* (2013.01); *H01L 51/0591* (2013.01)
USPC ....................................... 252/500; 252/182.1

(58) Field of Classification Search
USPC ............................................... 252/500, 182.1
See application file for complete search history.

(56) References Cited

U.S. PATENT DOCUMENTS

| 4,987,042 A | 1/1991 | Jonas et al. | |
| 6,083,635 A * | 7/2000 | Jonas et al. | 428/690 |

(Continued)

OTHER PUBLICATIONS

Jang et al. "Chemical Sensors Based on Highly Conductive Poly(3,4-ethylene-dioxythiophene) Nanorods", Advanced Materials, 2005, 17, 1616-1620. Published online Jul. 1, 2005.*

(Continued)

*Primary Examiner* — Mark Eashoo
*Assistant Examiner* — Jane L Stanley
(74) *Attorney, Agent, or Firm* — Andrew Auerbach

(57) ABSTRACT

The present invention is directed to crystalline organic polymer nanoparticles comprising a conductive organic polymer; wherein the crystalline organic polymer nanoparticles have a size of from 10 nm to 200 nm and exhibits two current-voltage states: (1) a high resistance current-voltage state, and (2) a low resistance current-voltage state, wherein when a first positive threshold voltage ($V_{th1}$) or higher positive voltage, or a second negative threshold voltage ($V_{th2}$) or higher negative voltage is applied to the nanoparticle, the nanoparticle exhibits the low-resistance current-voltage state, and when a voltage less positive than the first positive threshold voltage or a voltage less negative than the second negative threshold voltage is applied to the nanoparticle, the nanoparticle exhibits the high-resistance current-voltage state. The present invention is also directed methods of manufacturing the nanoparticles using novel interfacial oxidative polymerization techniques.

11 Claims, 5 Drawing Sheets

(51) Int. Cl.
*H01L 51/00* (2006.01)
*H01B 1/12* (2006.01)
*H01L 51/05* (2006.01)

(56) References Cited

U.S. PATENT DOCUMENTS

| | | | |
|---|---|---|---|
| 6,791,738 | B2 | 9/2004 | Reynolds et al. |
| 2004/0063100 | A1 | 4/2004 | Wang |
| 2005/0270442 | A1* | 12/2005 | Yang et al. ............... 349/86 |
| 2006/0207878 | A1* | 9/2006 | Myung et al. ........... 204/403.09 |
| 2007/0200099 | A1* | 8/2007 | Lee et al. ................. 252/500 |
| 2009/0212275 | A1* | 8/2009 | Park et al. ............... 257/9 |

OTHER PUBLICATIONS

Malinauskas et al. "Conducting polymer-based nanostructurized materials: electrochemical aspects", Nanotechnology, 16 (2005), R51-R62. Published Aug. 16, 2005.*
Choi et al. "Poly(3,4-ethylenedioxythiophene) nanoparticles prepared in aqueous DBSA solutions", Synthetic Metals, 141 (2004), 293-299. Published Mar. 25, 2004.*
Kai Su et al. "Fast Conductance Switching in Single-Crystal Organic Nanoneedles Prepared from an Interfacial Polymerization-Crystallization of 3,4-Ethylenedioxythiophene", Advanced Material, Feb. 2007, 19, 669-672.*
Nurxat Nuraje et al. "Liquid/Liquid Interfacial Polymerization to Grow Single Crystalline Nanoneedles of Various Conducting Polymers", ACSNano, vol. 2, No. 3, 502-506. Mar. 2008.*
Kai Su et al. "First Preparations and Characterization of Conductive Polymer Crystalline Nanoneedles", Macromol. Symp. 2009, 279, 1-6.*
M. Gross et al., "Improving the performance of doped π-conjugated polymers for use in organic light-emitting diodes", Nature 405, 661 (2000).
S. Tretiak, A. Saxena, R. L. Martin, A. R. Bishop, "Photoexcited breathers in conjugated polyenes: An excited-state molecular dynamics study", Proc. Natl. Acad. Sci. U.S.A. 100, 2185 (2003).
L. Chen et al., "Highly sensitive biological and chemical sensors based on reversible fluorescence quenching in a conjugated polymer", Proc. Natl. Acad. Sci. U.S.A. 96, 12287 (1999).
F. Hide et al, "Semiconducting Polymers" A New Class of Solid-State Laser Materials, Science 273, 1833 (1996).
C. D. Dimitrakopoulos, D. J. Mascaro, "Organic thin-film transistors: A review of recent advances", IBM J. Res. Dev. 45, 11 (2001).
C. P. Collier, et al., "Electronically Configurable Molecular-Based Logic Gates", Science 285, 391 (1999).
H. X. He et al., "A Conducting Polymer Nanojunction Switch", J. Am. Chem. Soc. 123, 7730 (2001).
G. K. Ramachandran et al., "A Bond-Fluctuation Mechanism for Stochastic Switching in Wired Molecules", Science 300, 1413 (2003).
K. Terabe, T. Hasegawa, T. Nakayama, M. Aono, "Quantized conductance atomic switch", Nature 433, 47 (2005).
H. Sakaguchi, H. Matsumura, H. Gong, "Electrochemical epitaxial polymerization of single-molecular wires", Nature Materials 3, 551 (2004).
H. Sirringhaus, et al., "Two-dimentional charge transport in self-organized, high-mobility conjugated polymers", Nature 401, 685 (1999).
H. Meng et al., "Solid-State Synthesis of a Conducting Polythiophene via an Unprecedented Heterocyclic Coupling Reaction", J. Am. Chem. Soc. 125, 15151 (2003).
A. J. Heeger, Angew. "Semiconducting and Metallic Polymers: The Fourth Generation of Polymeric Materials (Nobel Lecture)**", Chem. Int. Ed. 40, 2591 (2001).
R. D. McCullough, "The Chemistry of Conducting Polythiophenes**", Adv. Mater. 10, 93 (1998).
J. Huang, R. B. Kaner, "A General Chemical Route to Polyaniline Nanofibres", J. Am. Chem. Soc. 126, 851 (2004).
J. Joo et al., "Charge transport of the mesoscopic metallic state in partially crystalline polyanilines", Phys. Rev. B 57, 9567 (1998).
Z. Mo et al., "X-ray Scattering from Polythiophene: Crystallinity and Crystallographic Structure", Macromolecules 18, 1972-1977 (1985).
L. Groenendaal, F. Jonas, D. Freitag, H. Pielartzik, J. R. Reynolds. "Poly(3,4-3ethylenedioxythiophene) and Its Derivatives: Past, Present, and Future**", Adv. Mater. 12, 481 (2000).
K. E. Aasmundtveit et al., Structural aspect of electrochemical doping and dedoping of poly (3,4-ethylenedioxythiophene), Synth. Met. 113, 93 (2000).
L Niu, C. Kvamstrom, K. Froberg, A. Ivaska, "Electrochemically controlled surface morphology and crystallinity in poly (3,4-ethylenedioxythiophene) films", Synth. Met. 122, 425 (2001).
Z. J. Donhauser et al., "Conductance Switching in Single Molecules Through Conformational Changes", Science 292, 2303 (2001).
Kirchmeyer, S., and Reuter, K., 2005. "Scientific Importance, Properties, and Growing Applications of Poly(3,4-ethylenedioxythiophene)". Journal of Materials Chemistry 15: 2077-2088.

* cited by examiner (SCHEME 1)

SYNTHESIS OF POLYMER NANOSTRUCTURES WITH CONDUCTANCE SWITCHING PROPERTIES

CROSS-REFERENCE TO PRIOR APPLICATION

This application is the U.S. National Phase of International Patent Application Ser. No. PCT/US2007/080206, filed on Oct. 2, 2007, which claims the benefit of U.S. Provisional Patent Application Ser. No. 60/827,808, filed on Oct. 2, 2006, both of which are hereby incorporated by reference in their entireties.

The research leading to the present invention was supported, in part, by Grant No. DEFG-02-01ER45935 from the U.S. Department of Energy, and Grant Nos. 2-S06-GM60654 and G12-RR-03037 from the National Institutes of Health. Accordingly, the United States Government may have certain rights in the invention. Additionally, NSF support through MRSEC for Polymers at Engineered Interfaces is acknowledged.

FIELD OF THE INVENTION

The present invention generally relates to polymer nanostructures with conductance switching properties, methods of preparation thereof, their use as switches in transistors, logic gates, circuits and computer memories.

BACKGROUND OF THE INVENTION

Nanometer-scale science has been an exciting area of recent research investigations with fundamental as well as technological significance. As a result, new physical phenomena resulting from novel nanoelectronic devices have been discovered and continue to be anticipated. Based on their versatile electronic properties and adaptability to a broad range of processing methods, conjugated systems have been applied successfully to the area of organic electronics (1-10). However, the development of fundamental methods for the design and development of polymer-based nanoelectronics is still in its infancy.

In recent years, characteristics of organic electronic materials have been remarkably improved. In particular, the so-called organic bistable materials where, if a voltage is applied to the material, an electric current in a circuit rapidly increases at a voltage above a threshold value (i.e., the circuit is ON) as compared to a much lower current when the voltage is below the threshold value (i.e., the circuit is OFF). This switching phenomenon has found applications for switching elements for, e.g., driving the organic EL display panels or for high-density memories.

Most bulk conducting polymer systems that have been created consist of regions of inhomogeneity. The investigation of processes in pure crystalline materials is critical in ascertaining the inherent electronic properties of polymer nanoelements. The searches for nanosized and molecular switches have been of critical importance for the development of nanoelectronics. Potential switches include interlocked co-comformers (6), conjugated organic oligomers (8) and redox-induced junction formation (9). Similar to oligomers, conjugated polymers also showed switching behaviors. The first reported conducting polymer switch was based on polyaniline (7). Polyaniline nanojuctions were electrochemically synthesized as the bridge between gold electrodes. A decrease in switching time was observed when the electrode gap decreased to one nanometer. This decrease in switching time was thought to be one of the characteristics of the single crystalline domains, although the crystalline nature of the junction was not experimentally verified. Although highly ordered structures have been prepared by electrochemical epitaxial polymerization (10), solution spin-coating on functionalized surface (11) and solid-state polymerization of pre-organized monomers (12), nanostructures based on single crystals of conducting polymer have not been reported. To date, polythiophenes together with polyanilines and polypyrroles represent the most important group of conductive polymers for application in nanoscale molecular switching devices.

SUMMARY OF THE INVENTION

The novel polymer nanoparticles of the present invention include:

a crystalline organic polymer nanoparticle comprising a conductive organic polymer, wherein the crystalline organic polymer nanoparticle has a size of from 10 nm to 200 nm and exhibits two current-voltage states:

(1) a high resistance current-voltage state, and (2) a low resistance current-voltage state, wherein when a first positive threshold voltage ($V_{th1}$) or higher positive voltage, or a second negative threshold voltage ($V_{th2}$) or higher negative voltage is applied to the nanoparticle, the nanoparticle exhibits the low-resistance current-voltage state, and when a voltage less positive than the first positive threshold voltage or a voltage less negative than the second negative threshold voltage is applied to the nanoparticle, the nanoparticle exhibits the high-resistance current-voltage state.

The novel polymer nanoparticles of the present invention further include:

an ability to switch from a high-resistance current-voltage state to a low-resistance current-voltage state, wherein when a bias voltage ($V_b$) is applied to the nanoparticle such that the nanoparticle exhibits a high-resistance current-voltage state, and the bias voltage is:

(1) changed to the first positive threshold voltage ($V_{th1}$) or higher positive voltage, or (2) changed to the second negative threshold voltage ($V_{th2}$) or higher negative voltage, the nanoparticle switches from a high-resistance current-voltage state to a low-resistance current-voltage state in from about 1 milliseconds to about 1000 milliseconds.

The novel polymer nanoparticles of the present invention further include:

an ability to switch from a low-resistance current-voltage state to a high-resistance current-voltage state, wherein when a bias voltage ($V_b$) is applied to the nanoparticle such that the nanoparticle exhibits a low-resistance current-voltage state, and the bias voltage is:

(1) changed to a voltage less positive than the first positive threshold voltage, or (2) changed to a voltage less negative than the second negative threshold voltage, the nanoparticle switches from the low-resistance current-voltage state to the high-resistance current-voltage state in from 1 milliseconds to 1000 milliseconds.

The novel methods of the present invention for fabricating the aforementioned crystalline organic polymer nanoparticles include:

(1) providing a biphase comprising an organic phase and an aqueous phase, wherein
the organic phase comprises one or more organic soluble monomers, wherein the concentration of the one or more monomers in the organic phase is from 0.1 to 10 mg/mL; and wherein
the aqueous phase comprises one or more water soluble oxidants, wherein the concentration of the one or more oxidants in the aqueous phase is from 0.1 to 10 mg/mL;
(2) reacting the one or monomers with the one or more oxidants to precipitate the crystalline organic polymer nanoparticles.

The novel polymer nanoparticles of the present invention have conductive switching properties with response times of less than one second and, preferably, their method of production allow nanoparticles that possess variable first positive and second negative threshold voltage values ($V_{th1}$ and $V_{th2}$) for use in conductive switching applications at different voltage switching points.

The novel polymer nanoparticles of the present invention can also be prepared using other methods known in the art, such as, reverse micelles and microemulsions.

The novel polymer nanoparticles of the present invention have conductive switching properties that provide for wide applications as switches in circuits, transistors, logic gates, and computer memory.

In some embodiments, the nanoparticles of the invention are in the form of a plurality of single crystal organic polymer nanoneedles, comprising a conductive organic polymer selected from the group selected from polythiophenes, polyanilines and polypyrroles.

BRIEF DESCRIPTION OF THE DRAWINGS

Non-limiting and non-exhaustive embodiments of the present invention are described with reference to the following drawings.

For a better understanding of the present invention, reference will be made to the following Detailed Description, which is to be read in association with the accompanying drawings, wherein:

FIG. 1(A) represents a TEM image of the PEDOT nanocrystals,

FIG. 1(B) represents a single nanoneedle image of the PEDOT nanocrystals,

FIG. 1(C) represents an HRTEM image of the PEDOT nanocrystals, and

FIG. 1(D) represents an electron diffraction pattern of the PEDOT nanocrystals. Scale bar=200 nm in FIG. 1(A), 20 nm in FIG. 1(B). The white arrows in FIG. 1(C) show the chain spacing distance of 0.6 nm, which was confirmed in the electron diffraction results (∀=0.584 nm, in FIG. 2 and Table 1).

DETAILED DESCRIPTION OF THE INVENTION

Figure 1:
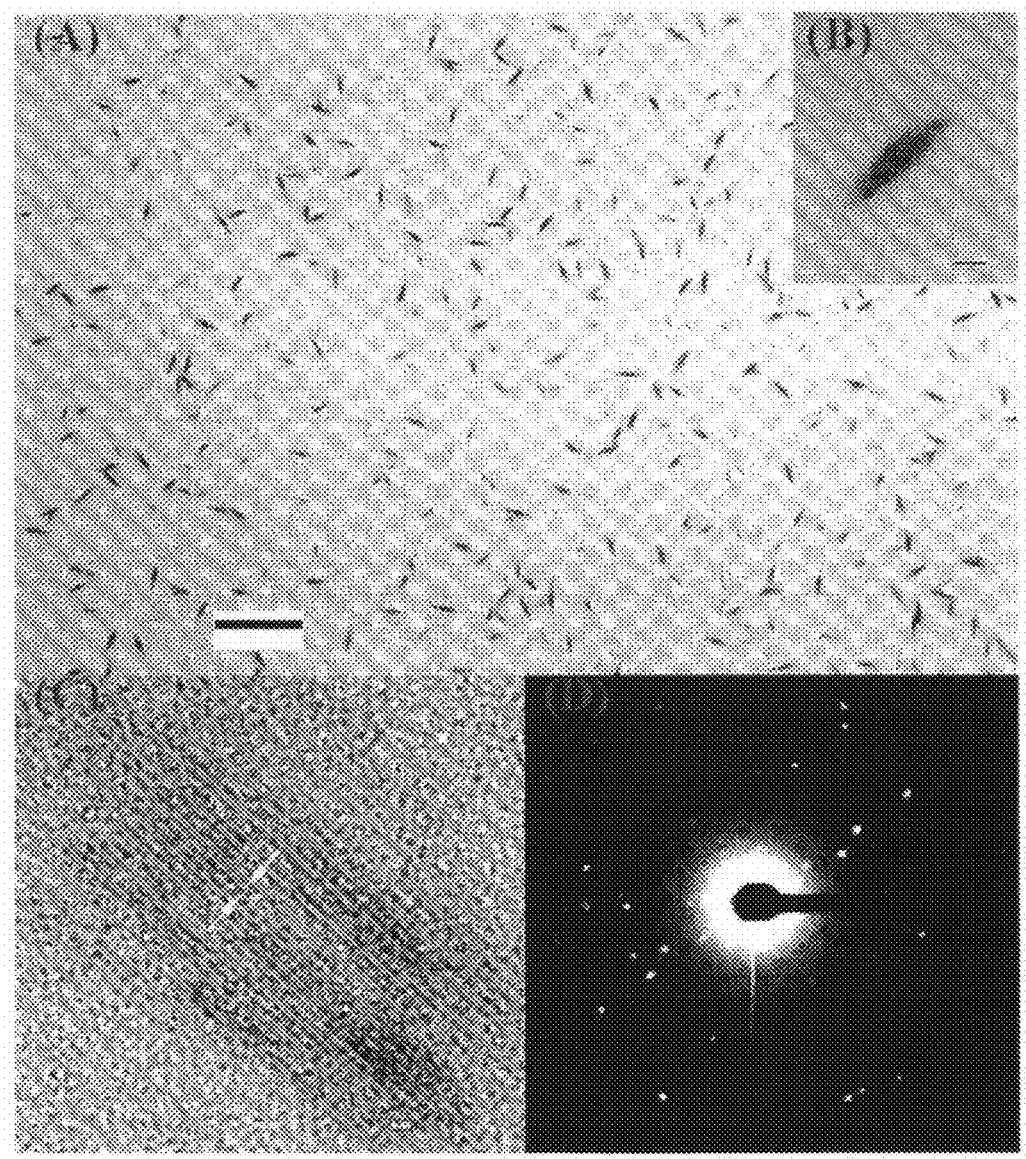
FIG. 1 represents PEDOT nanocrystals prepared according to one embodiment of the present method.

We report here the first synthesis of novel crystalline polymer nanoparticles, such as crystalline nanoneedles, with conductance switching properties in, for example, a single nanocrystalline element. The conductance switching property occurs from a low-resistance current-voltage state to a high-resistance current-voltage state (or vice versa) rapidly, for example, in from 1 millisecond to 1000 milliseconds. This, for example, millisecond switching response time is significantly faster than the switching times achieved from prior art molecular switches that can, for example, take up to one hour or more.

In preferred embodiments of the present invention, the polymer nanoparticles comprise single crystals of polythiophenes, polyanilines, or polypyrroles. In some embodiments, the methods of the present invention provide for the polythiophenes (e.g., poly(3,4-ethylenedioxythiophene); PEDOT), polyanilines (e.g., polyaniline; PANI) and polypyrroles (e.g., polypyrrole; PPY) to be in the form of crystalline nanoneedles wherein the length to width ratio of the nanoneedles is from 1.5:1 to 15:1, preferably from 2.5:1 to 5:1. The length of the nanoneedles fabricated according to the methods of present invention is from 15 to 200 nm, preferably from 30 to 80 nm.

In a particularly preferred embodiment, the crystalline organic polymer nanoparticle comprises a poly(3,4-ethylenedioxythiophene) single crystal, characterized by the orthorhombic space group, and unit cell parameters comprising: crystal axis lengths of a=0.584 nm, b=0.494 nm, c=0.796 nm and angles between the crystal axes of $a=\beta=\gamma=90°$. Preferably the crystalline poly(3,4-ethylenedioxythiophene) single crystal is a nanoneedle, wherein the length to width ratio of the nanoneedles is from 1.5:1 to 15:1, preferably from 2.5:1 to 5:1. The length of the nanoneedles fabricated according to the methods of present invention is from 15 to 200 nm, preferably from 30 to 80 nm.

The term "high-resistance current-voltage state" as used herein refers to a state of a substance which has a conductivity of $10^2$ S/cm or higher; The term "low-resistance current-voltage state" as used herein refers to a state of a substance which has a conductivity of $10^{-6}$ S/cm or lower.

The nanoparticle switches from the low-resistance current-voltage state to the high-resistance current-voltage state (and vice versa) in from 1 milliseconds to 60 seconds, preferably from 1 millisecond to 1000 milliseconds. However, the lower limit of this range is dictated by the limit of detection of the scanning tunneling spectroscopy methods used to test the switching speed of the nanocrystals. Thus, it is switching speed on the nanoparticles of the present invention could be significantly faster than 1 millisecond.

The term "threshold voltage" as used herein refers to the voltage that, when applied to the nanoparticles of the present invention, causes the nanoparticle to switch from a low-resistance current-voltage state to a high-resistance current-voltage state, or vice versa. Typically, the voltage applied to the nanoparticles is increased or decreased incrementally and the threshold voltage determined by a rapid change in the conductance properties of the crystals.

The novel polymer nanoparticles of the present invention have conductive switching properties with response times of less than one second and, preferably, their method of production allow nanoparticles that possess variable first positive and second negative threshold voltage values ($V_{th1}$ and $V_{th2}$) for use in conductive switching applications at different voltage switching points. In a preferred embodiment of the present invention, the crystalline organic polymer nanoparticles wherein the first positive threshold voltage value ($V_{th1}$) is from 4 to 2 volts and the second negative threshold voltage value ($V_{th2}$) is from −2 to −4 volts. Most preferably, the first positive and second negative threshold voltage values have approximately the same absolute value (e.g., $V_{th1}$ is 3 volts and $V_{th2}$ is −3 volts) so that the crystalline organic polymer nanoparticle act as a symmetrical isotropic switch.

The novel polymer nanoparticles of the present invention (e.g., the PEDOT nanoneedles) are preferably prepared by an oxidative coupling polymerization reaction that occurs in an organic/aqueous biphase, wherein the biphase comprises one or more water soluble oxidants and one or more organic soluble monomers that will react to form the polymer chains within the nanoparticle. Without wishing to be bound to any particular theory, the synthesis of the novel nanoparticles of the present invention occurs through an interfacial polymerization-crystallization process. In some embodiments, interfacial polymerization-crystallization yields highly crystalline conductive polymers when an extended crystallization time at the liquid/liquid interfaces was employed to increase the degree of crystallization. In preferred embodiments, lower concentrations of monomers and oxidants in the organic and aqueous solutions were employed to further extend the crystallization time. These preferred interfacial methods of the present invention produced single crystalline nanocrystals.

Bulk samples of conducting polymers are considered, in general, as inhomogeneous systems with isolated crystalline domains (15, 16). As detailed in previous studies (17-19), the structural order in polythiophene and its derivatives is typically complicated. To obtain a highly crystalline conducting polymer sample, special techniques need to be applied. For example, a thorough study for the syntheses of polythiophene derivatives (12) indicated that highly crystalline conducting polymers can be obtained by a coupling reaction of pre-organized monomers, indicating the importance of the orientation of the propagation process for obtaining highly ordered conducting polymers.

The organic phase employed in the methods of the present invention can include organic solvent which is immiscible with water and capable of dissolving the monomers employed in the methods of the invention. These solvents include but are not limited to alkanes, cycloalkanes, ethers, alkyl acetates, and chlorinated hydrocarbon solvents. Preferred solvents for the organic phase are alkanes, chlorinated hydrocarbon solvents and water immiscible alkyl alcohols, most preferably, dichloromethane, pentane, hexane and n-butanol.

The oxidant employed in the methods of the present invention can be any water soluble oxidant that is capable of facilitating the interfacial polymerization embodied within the present methods. Preferred oxidants include $FeCl_3$, hydrogen peroxide, ammonium persulfate, and the like.

The monomers that can be used in the methods of the present invention can be any monomers that are soluble in the organic phase and which can be used to synthesize polymers with conductive properties. Preferred monomers are aniline, pyrrole, 3,4-ethylenedioxythiophene and derivatives of aniline, pyrrole or thiophene. Particularly preferred is 3,4-ethylenedioxythiophene.

The concentration of the one or more monomers in the organic phase is from 0.1 to 10 mg/mL, preferably from 0.5 to 5 mg/mL, and most preferably from 0.8 to 1.2 mg/mL.

The concentration of the one or more oxidants in the organic phase is from 0.1 to 10 mg/mL, preferably from 0.5 to 5 mg/mL, and most preferably from 0.8 to 1.2 mg/mL.

The monomers are allowed to react with the oxidant until the nanoparticles, preferably nanoneedles, precipitate from the biphase. The preferred reaction time is from about 10 to 80 hr, more preferably from 24 to 48 hr.

Without further elaboration, it is believed that one skilled in the art can, using the preceding description, utilize the present invention to its fullest extent. The following examples are, therefore, to be construed as merely illustrative, and not limitative of the remainder of the disclosure in any way whatsoever.

EXAMPLES

Materials and Apparatus 3,4-ethylenedioxythiophene, pyrrole, aniline, ferric chloride, dichloromethane, and dialysis tubing were purchased from Aldrich Chemical Co. Transmission electron microscopic (TEM) and High resolution transmission electron microscopic (HRTEM) studies were conducted on JEOL 1200 EX and Tecnai G2 F20 cryoelectron microscopes respectively; STM/STS studies followed the processes described in our previous contribution on both PicoSPM II (Agilent) and Nanoscope IIIa MultiMode (Veeco) microscopes for study and comparison.[25]

Synthesis of Nanoneedle Shape Conducting Polymers:

In a typical synthesis, 3,4-ethylenedioxythiophene, aniline or pyrrole monomers were dissolved in dichloromethane (DCM, 5 mL, 1 mg/mL) to form the bottom organic layer and the oxidant, ferric chloride ($FeCl_3$), in deionized water (5 mL, 0.1 mg/mL) to form the upper water layer. After interfacial system was established, the aqueous layer was collected after 48 hrs.

Figure 5:
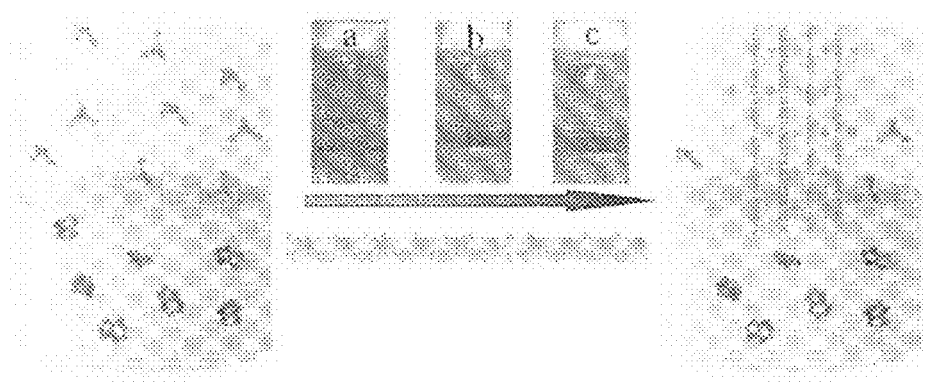
FIG. 5 (SCHEME 1) illustrates one embodiment of the interfacial crystallization-polymerization of EDOT by oxidative coupling using $FeCl_3$. The polymerization was conducted in a 20 mL vial containing 5 mL EDOT solution (1 mg/mL) in dichloromethane as the lower layer and 5 mL $FeCl_3$ solution (1 mg/mL) in water as the upper layer. After 2 days, part of water layer was then taken for characterizations. The vials labeled A-C show the reaction at reaction times are 0, 1, and 2 days, respectively.

PEDOT Nanocrystals using DCM as the Organic Phase:

Applying an interfacial orientation polymerization process, single crystals of poly(3,4-ethylenedioxythiophene) (PEDOT) were prepared nanoneedle form. The aqueous/organic interfacial system used was composed of 3,4-ethylenedioxythiophene (EDOT) in an organic solvent and an oxidant, ferric chloride ($FeCl_3$), in DI water (FIG. 5 (Scheme 1)). In a typical synthesis, EDOT dissolved in dichloromethane (DCM, 5 mL, 1 mg/mL) served as the lower organic layer and $FeCl_3$ dissolved in DI water (5 mL, 1 mg/mL) as the upper water layer. The oxidative coupling polymerization of EDOT at the aqueous/organic interface was facilitated by $FeCl_3$ (13), representing a system of crystallization during polymerization. The PEDOT samples were usually collected after 48 hours. In this example, EDOT was chosen as the monomer because of the low band gap and the coplanarity of its polymer; the slow coupling polymerization allowed for the orientation crystallization induced by the interface to give an optimized crystalline form.

Figure 2:
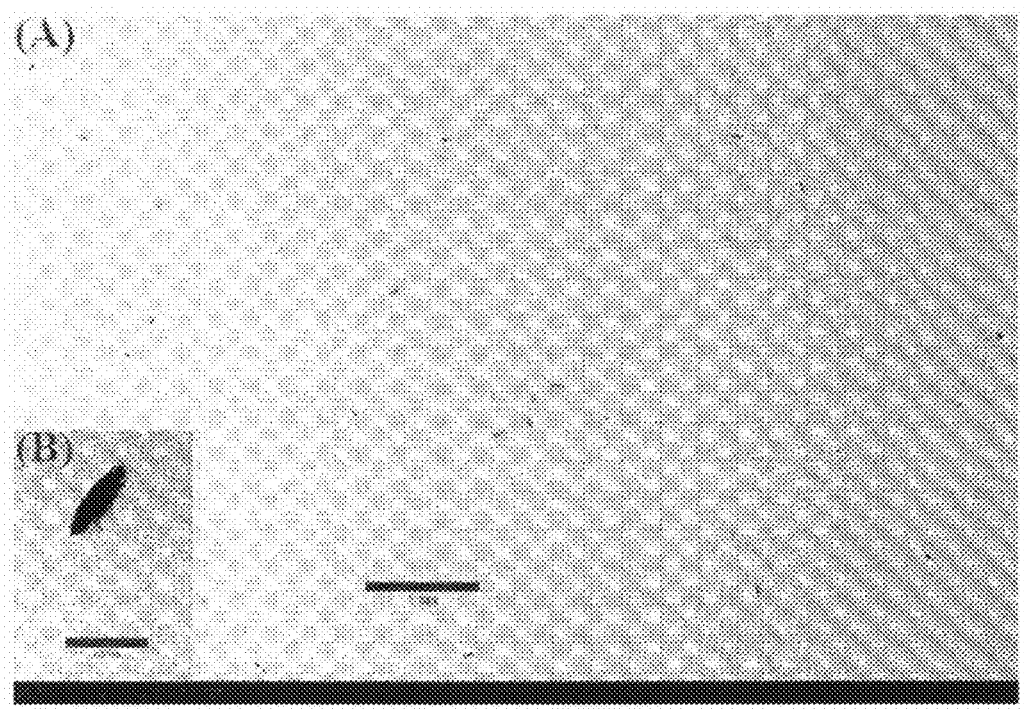
FIG. 2 represents TEM images of PEDOT nanoneedles prepared from one embodiment of the invention wherein pentane was used as the organic upper layer during an interfacial. Scale bar=FIG. 2(A)=1 μm, FIG. 2(B)=100 nm.

PEDOT Nanocrystals using Pentane as the Organic Phase:

To examine the influences of growth direction, we used pentane instead of DCM as the organic layer for EDOT monomers (with all other parameters the same as the DCM example above). The pentane layer serves as the upper layer and the growth direction was in the gravity direction. The TEM images (FIG. 2) shows a similar nanoneedle structure. But the tips of the nanoneedles are not as sharp as those from DCM. Further studies are being focused on controlling the shape, dimension, and size distribution of the nanoneedles by systematic selected combinations of parameters including temperature, nature of the two layers, and growth direction.

Analysis of PEDOT Nanocrystals:

The PEDOT products made according to the example above show nanoneedle structures (FIGS. 1a, b transmission electron microscopic (TEM) images). The PEDOT nanoneedles have an average length of about 50 nm and a width of about 15 nm with pointed tips. High-resolution TEM (HR-TEM, FIG. 1c) and Electron diffraction (FIG. 1d) results from the same sample give further structural details of the nanoneedle. The HRTEM image shows a vivid lattice structure. The oxidation polymerization proceeds with directed orientation growth (Scheme 1). The PEDOT nanoneedles were lifted gradually from the interface into the water phase as polymer nanoneedle being formed. HRTEM and electron diffraction patterns support the single crystal nature of the resulting nanoneedles.

Although different lattice dimensions were obtained for PEDOT from different syntheses, the lattice units can be assigned as orthorhombic lattice (18, 19). The lattice constants a, b, and c are assigned as the lateral chain spacing, π-π stacking distance, and repeating unit length respectively. The length of the repeating unit, c, should not differ too much among different synthetic systems. On the other hand, a and b can have significant variations depending on the monomer and polymerization method. The electron diffraction pattern (FIG. 1d) shows well-defined diffraction spots, indicating the nanoneedles as highly ordered single crystals. Table 1 shows a tabulation of the calculated lattice distances from the diffraction spots. From these data, the lattice unit was assigned as a=0.584 nm, b=0.494 nm, and c=0.796 nm. The angles between the crystal axes of a=β=γ=90°. This interchain spacing parameter a is confirmed by HRTEM (lattice shown in FIG. 1c) with lateral spacing of ca. 0.6 nm marked by arrows. The π-π stacking distance is assigned as b with a value of 0.494 nm, a much closer stacking than that of other PEDOT systems at the level of 0.7 nm (18).

TABLE 1

| lattice assignment of diffraction pattern | |
|---|---|
| d(nm) | Indices |
| 0.796 | 001 |
| 0.584 | 100 |
| 0.494 | 010 |
| 0.427 | — |
| 0.398 | 002 |
| 0.344 | — |
| 0.292 | 200 |
| 0.265 | 003 |
| 0.231 | 020 |

Figure 3:
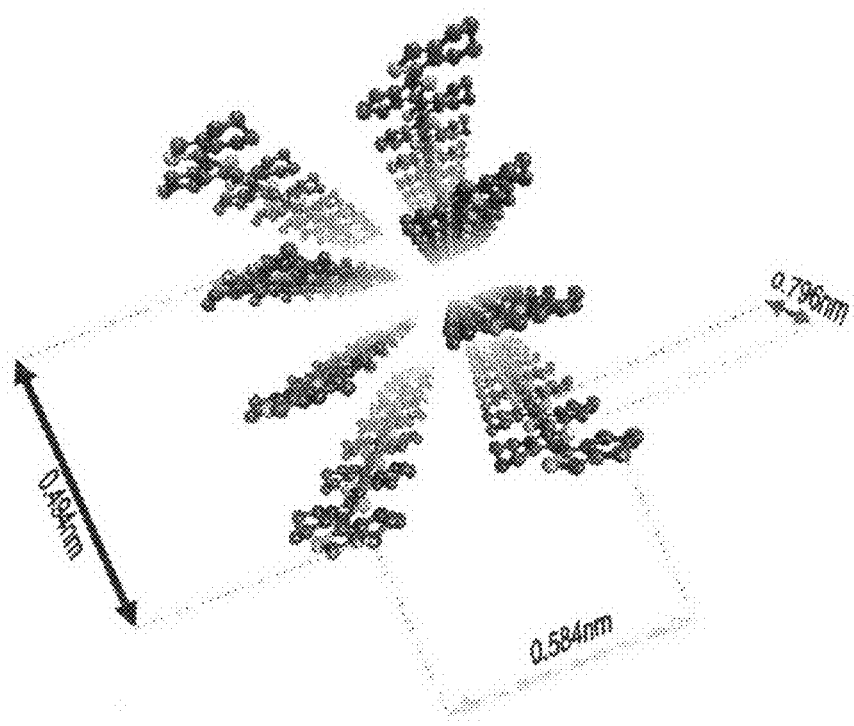
FIG. 3 represents a schematic representation of chain arrangement for a PEDOT nanoneedle prepared according to one embodiment of the present invention. The eight PEDOT segments represent partial polymer chains. As represented in the orthorhombic lattice units: chain spacing a=0.584 nm, π-π stacking distance b=0.494 nm, and repeating unit distance c=0.796 nm.

The analysis results from TEM, HRTEM and electron diffraction converge to support our first synthesis of highly ordered PEDOT nanoneedles with an unusually close π-π stacking. The longest molecular chains aligned from tip to tip of the nanoneedle have ca. 63 repeating units in a 50-nm long needle. FIG. 3 shows a schematic representation of the polymer chain arrangement in the nanoneedle.

Because of their special morphological and crystalline structures, these nanoneedles show important electronic properties. Using scanning tunneling microscopy (STM) and scanning tunneling spectroscopy (STS), we studied their electronic conducting behaviors and discovered nanoneedle conductance switching with responsive times in the millisecond scale.

Analysis of Switch Behavior of PEDOT Nanoneedles:

For PEDOT STM/STS studies, the nanoneedle suspension was collected from the upper layer and dialysized for 10 hours to remove impurities. The purified suspension was then 10-fold diluted with DI water and spin-coated on a gold-111 (crystal form) surface.

The switching behavior was first established by STS (FIG. 4A). The tunneling current-voltage (I-V) curves were recorded from −4 v to 4 v bias voltage scale for both the PEDOT needles and the gold substrate. The gold-111 surface showed a typical metallic tunneling I-V behavior. Unlike the gold surface, PEDOT nanoneedles showed abrupt switching behaviors at about −3 v and 3 v. The switching behavior is likely due to the electron injection at the PEDOT nanoneedle in the stacking direction of the chain. The plateau region of from −3 to 3 v can be assigned as OFF or insulating state (tunneling current<0.04 nA) of the switch. When the bias voltage increased to 3 v, the tunneling current abruptly jumped to above 10 nA. The two plateaus beyond 3 and +3 v are the ON or highly conducting state of the switch.

The switching process was in millisecond scale, much faster than that of molecular switches at longer than one hour (20). Different from most of semiconductors, the tunneling I-V curve of the nanoneedle jumped to high conductance level at 3 volt bias in a precipitous manner. At low applied field (0-3 volts), the barrier for electron injection was high enough to prevent the passage of tunneling electrons into PEDOT and the switching-off process took over As shown in FIG. 3A, the conductance state was assigned as ON state at bias voltage beyond 3 volts, and as OFF state from 0 to 3 volts.

Figure 4:
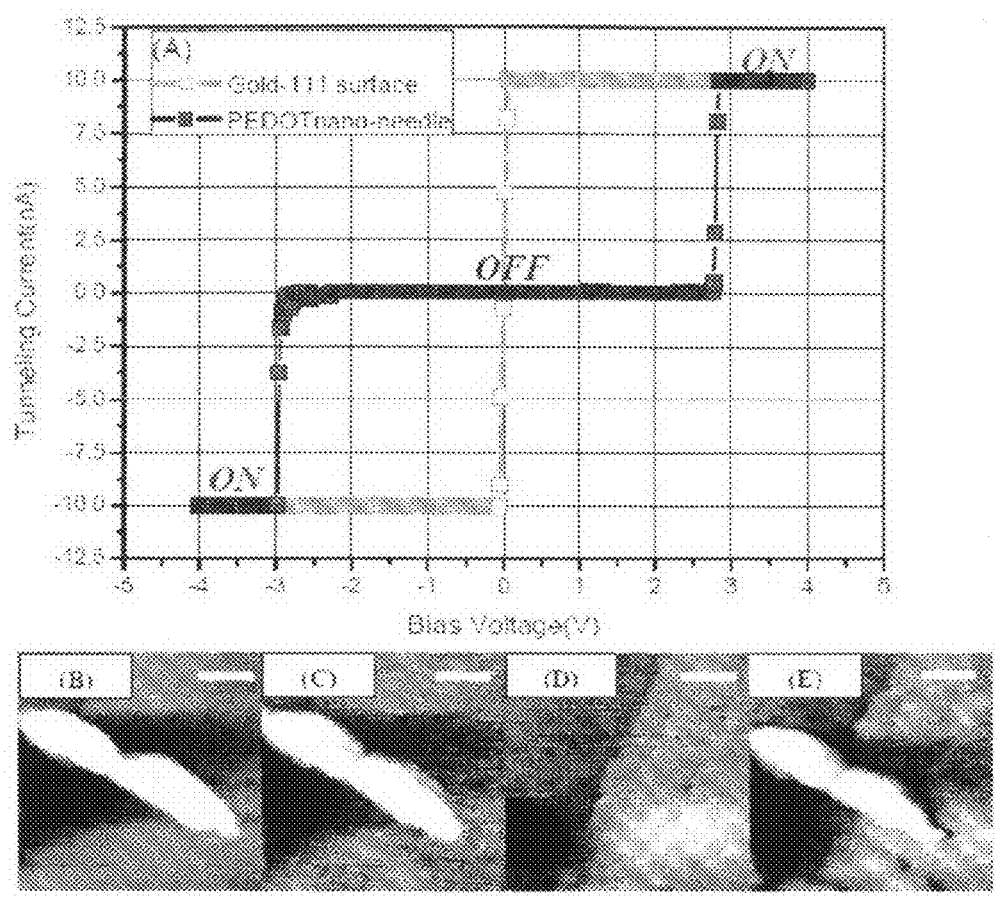
FIG. 4 illustrates the switching behavior of a PEDOT nanoneedle prepared according to one embodiment of the present invention: The STS experiments in FIG. 4(A) were conducted on an STM scanner (PicoSPM II, Molecular Imaging). The light grey square data points show a typical tunneling I-V curve of Gold-111. The dark grey square data points show the tunneling I-V curve of the PEDOT nanoneedle. The plateau between −3 and +3 volts was assigned as the OFF (low conductance) state and the two regions beyond ±3 volts were assigned as the ON (high conductance) states. The sweep time for both the curves was 10 seconds. Two hundred data points were collected for each curve. The switching response was estimated to be in the millisecond time scale. STM experiments were conducted on the same instrument using a constant current (100 pA) mode at a low servo level. The STM topological images represented in FIGS. 4(B-E) were collected at the scanning rate of 0.5 Hz, 8.5 minutes per frame. In the first three frames FIGS. 4(B-D), the bias voltage was increased from 0.1 to 3 volts continuously. The bias voltages for the first three frames are for FIG. 4(B)=0.1, FIG. 4(C)=2.5, and FIG. 4(D)=3 volts. When the bias voltage returned to 0.1 volts in FIG. 4(E) (E), the needle reappeared indicating that the conductance returned to the low level. The scale bar in FIGS. 4(B-E)=20 nm.

This nanoneedle conductance switch was also supported by STM experiment. Constant current mode (set point=100 pA) at low servo level was used to obtain the STM images. Individual nanoneedle was chosen for the observation. In FIG. 4 (B-D), continuous scanning, eight minutes per scan, was employed. With the increasing of the bias voltage, the conductance of the nanoneedle was negligible from 0.1 (FIG. 4B) to 2.5 (FIG. 4C) volts. When the bias voltage reached to 3.0 volts (FIG. 4D), the needle became invisible, indicating a high conductance close to metal level. When the bias voltage returned to 0.1 v (FIG. 4E), the needle reappeared indicating the returning of the conductance to the original low level.

REFERENCES

1. M. Gross et al. *Nature* 405, 661 (2000).
2. S. Tretiak, A. Saxena, R. L. Martin, A. R. Bishop, *Proc. Natl. Acad. Sci. U.S.A.* 100, 2185 (2003).
3. L. Chen et al., *Proc. Natl. Acad. Sci. U.S.A.* 96, 12287 (1999).
4. F. Hide et al, *Science* 273, 1833 (1996).
5. C. D. Dimitrakopoulos, D. J. Mascaro, *IBM J. Res. Dev.* 45, 11 (2001).
6. C. P. Collier, et al., *Science* 285, 391 (1999).
7. H. X. He et al., *J. Am. Chem. Soc.* 123, 7730 (2001).
8. G. K. Ramachandran et al., *Science* 300, 1413 (2003).
9. K. Terabe, T. Hasegawa, T. Nakayama, M. Aono, *Nature* 433, 47 (2005).
10. H. Sakaguchi, H. Matsumura, H. Gong, *Nature Materials* 3, 551 (2004).
11. H. Sirringhaus, et al., *Nature* 401, 685 (1999).
12. H. Meng et al., *J. Am. Chem. Soc.* 125, 15151 (2003).
13. A. J, Heeger, *Angew. Chem. Int. Ed.* 40, 2591 (2001)
14. R. D. McCullough, *Adv. Mater.* 10, 93 (1998).
15. J. Huang, R. B. Kaner, *J. Am. Chem. Soc.* 126, 851 (2004).
16. J. Joo et al., *Phys. Rev. B* 57, 9567 (1998).
17. Z. Mo et al., *Macromoleculcs* 18, 1972-1977 (1985).
18. L. Groenendaal, F. Jonas, D. Freitag, H. Pielartzik, J. R. Reynolds. *Adv. Mater.* 12, 481 (2000).
19. K. E. Aasmundtveit et al., *Synth. Met.* 113, 93 (2000).
20. L Niu, C. Kvarnstrom, K. Froberg, A. Ivaska, *Synth. Met.* 122, 425 (2001).
21. Z. J. Donhauser et al., *Science* 292, 2303 (2001).

What is claimed is:

1. A single crystalline organic polymer nanoneedle comprising a conductance switching organic polymer, wherein the crystalline organic polymer nanoneedle has a length from 10 nm to 80 nm and exhibits two current-voltage states: (1) a high resistance current-voltage state, and (2) a low resistance current-voltage state, wherein when a first positive threshold voltage ($V_{th1}$) or higher positive voltage, or a second negative threshold voltage ($V_{th2}$) or higher negative voltage is applied to the nanoneedle, the nanoneedle exhibits the low-resistance current-voltage state, and when a voltage less positive than the first positive threshold voltage or a voltage less negative than the second negative threshold voltage is applied to the nanoneedle, the nanoneedle exhibits the high-resistance current-voltage state.

2. The crystalline organic polymer nanoneedle of claim 1, wherein the nanoneedle exhibits an ability to switch from a low-resistance current-voltage state to a high-resistance current-voltage state, wherein when a bias voltage ($V_b$) is applied to the nanoneedle such that the nanoneedle exhibits a low-resistance current-voltage state, and the bias voltage is: (1) changed to a voltage less positive than the first positive threshold voltage, or (2) changed to a voltage less negative than the second negative threshold voltage, the nanoneedle switches from the low-resistance current-voltage state to the high-resistance current-voltage state in from 1 millisecond to 100 milliseconds.

3. The crystalline organic polymer nanoneedle of claim 2, wherein the nanoneedle exhibits an ability to switch from a high-resistance current-voltage state to a low-resistance current-voltage state, wherein when a bias voltage ($V_b$) is applied to the nanoneedle such that the nanoneedle exhibits a high-resistance current-voltage state, and the bias voltage is: (1) changed to the first positive threshold voltage ($V_{th1}$) or higher positive voltage, or (2) changed to the second negative threshold voltage ($V_{th2}$) or higher negative voltage, the nanoneedle switches from a high-resistance current-voltage state to a low-resistance current-voltage state in from about 1 milliseconds to about 100 milliseconds.

4. The crystalline organic polymer nanoneedle of claim 1, wherein the conductance switching organic polymer is selected from the group consisting of poly(3,4-ethylenedioxythiophene), polyaniline and polypyrrole.

5. The crystalline organic polymer nanoneedle of claim 4, wherein the conductance switching organic polymer is poly (3,4-ethylenedioxythiophene).

6. The crystalline organic polymer nanoneedle of claim 4, wherein the first threshold voltage ($V_{th1}$) is from +3.2 to 2.7 volts and the second threshold voltage ($V_{th2}$) is from −2.8 to −3.7-volts.

7. The crystalline organic polymer nanoneedle of claim 4, wherein the length to width ratio of the nanoneedle is from 1.5:1 to 15:1.

8. The crystalline organic polymer nanoneedle of claim 7, wherein the length to width ratio of the nanoneedle is from 2.5:1 to 5:1.

9. The crystalline organic polymer nanoneedle of claim 7, wherein length of the nanoneedle is from 15 nm to 80 nm.

10. The crystalline organic polymer nanoneedle of claim 9, wherein length of the nanoneedle is from 30 nm to 80 nm.

11. A single crystalline organic polymer nanoneedle comprising a conductance switching organic polymer, wherein the crystalline organic polymer nanoneedle has a length from 10 nm to 80 nm and exhibits two current-voltage states: (1) a high resistance current-voltage state, and (2) a low resistance current-voltage state, wherein when a first positive threshold voltage ($V_{th1}$) or higher positive voltage, or a second negative threshold voltage ($V_{th2}$) or higher negative voltage is applied to the nanoneedle, the nanoneedle exhibits the low-resistance current-voltage state, and when a voltage less positive than the first positive threshold voltage or a voltage less negative than the second negative threshold voltage is applied to the nanoneedle, the nanoneedle exhibits the high-resistance current-voltage state; and wherein
the nanoneedle being prepared by a process comprising the steps of:
(1) providing a biphase comprising an organic phase and an aqueous phase, wherein the organic phase comprises one or more organic soluble monomers, wherein the concentration of the one or more monomers in the organic phase is from 0.1 to 10 mg/mL; and wherein the aqueous phase comprises one or more water soluble oxidants, wherein the concentration of the one or more oxidants in the aqueous phase is from 0.1 to 10 mg/mL;
(2) reacting the one or more monomers with the one or more oxidants to form the polymer molecule concurrently with crystallization so as to produce a nanoneedle conductive polymer with switching properties.

* * * * *